United States Patent [19]

Ledenbach et al.

[11] Patent Number: 4,930,097
[45] Date of Patent: May 29, 1990

[54] ARCHITECTURE FOR AN IMPROVED PERFORMANCE OF A PROGRAMMABLE LOGIC DEVICE

[75] Inventors: Gregory W. Ledenbach, Orangevale; Michael J. Allen, Rescue, both of Calif.

[73] Assignee: Intel Corporation, Santa Clara, Calif.

[21] Appl. No.: 292,464

[22] Filed: Dec. 30, 1988

[51] Int. Cl.$^5$ .......................................... H03K 19/177
[52] U.S. Cl. ..................................... 364/716; 307/465
[58] Field of Search ......................... 364/716; 307/465

[56] References Cited

U.S. PATENT DOCUMENTS 4,124,899 11/1978 Birkner et al. ...................... 364/716
4,609,986 9/1986 Hartmann et al. .................. 364/200
4,617,479 10/1986 Hartmann et al. .................. 307/465

Primary Examiner—David H. Malzahn
Attorney, Agent, or Firm—Blakely, Sokoloff, Taylor & Zafman

[57] ABSTRACT

A programmable logic device in which memory cells are removed from the signal path. Input signals are coupled to an inverting and non-inverting buffer, wherein the memory cells are coupled to enable the buffers. The stored state of each of the memory cells determines if a corresponding buffer is to be activated. In one embodiment, a memory cell is provided for each buffer and the output of each pair of complementary buffers is coupled together to provide an output. In another embodiment, the outputs of each pair of complementary buffers are inputted to a multiplexer, wherein a corresponding memory cell coupled to its multiplexer controls the selection of the signal or its complement to be outputted.

18 Claims, 5 Drawing Sheets

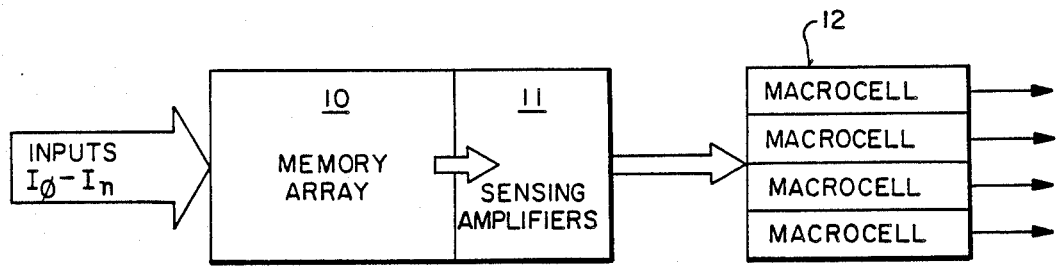
FIG_1
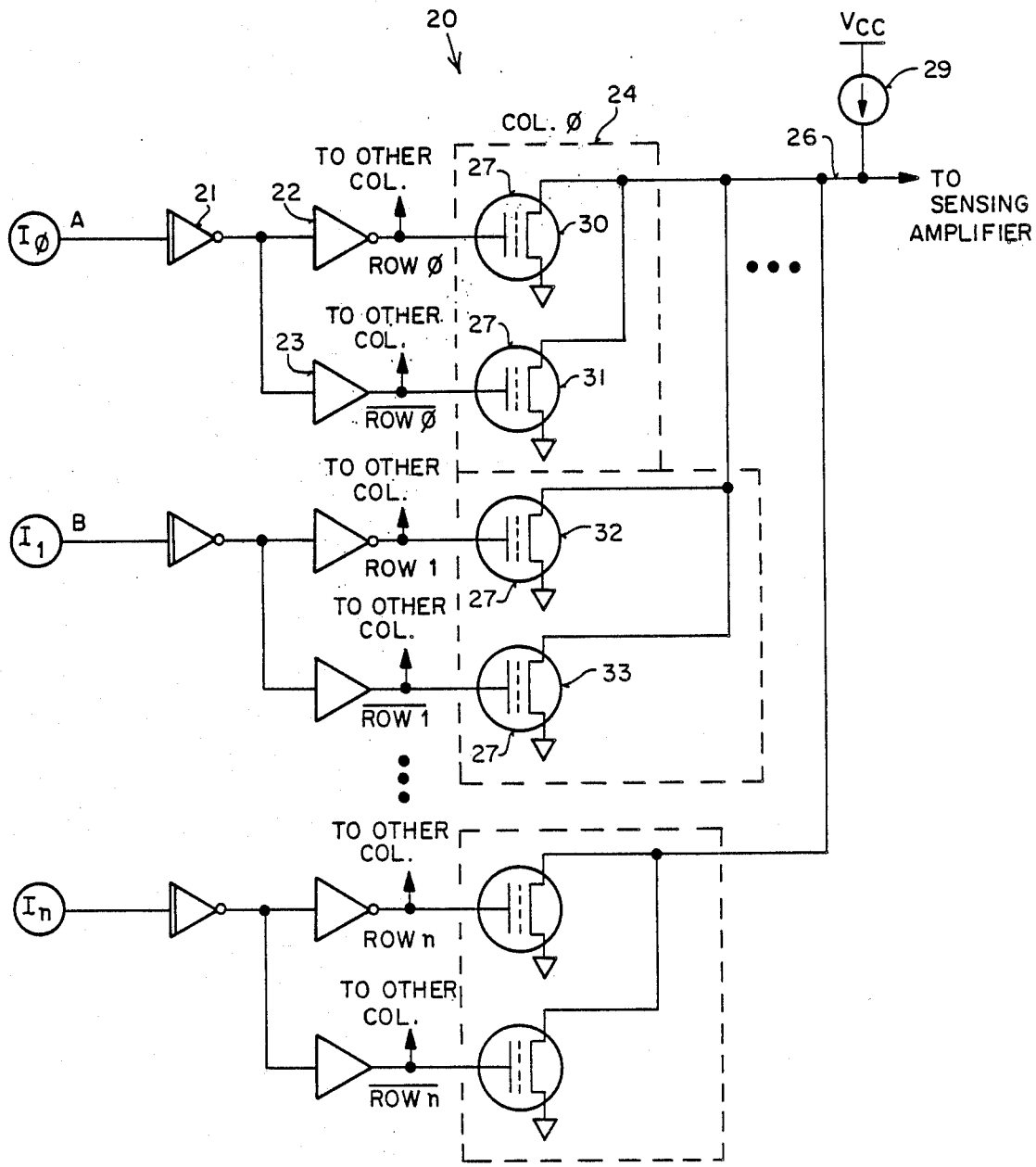
FIG_2 (PRIOR ART)

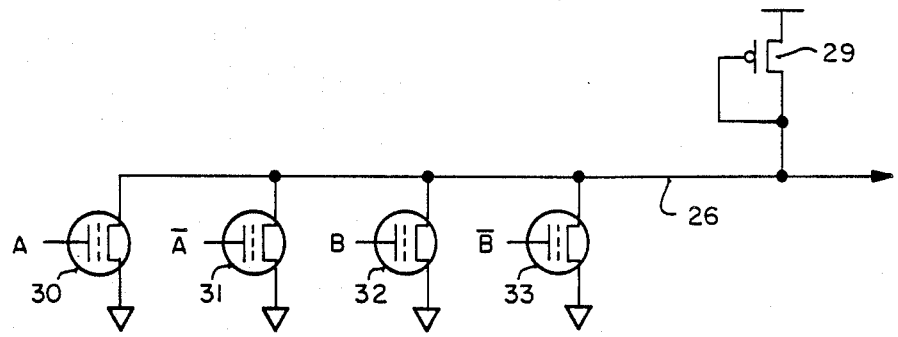
FIG_3 (PRIOR ART)
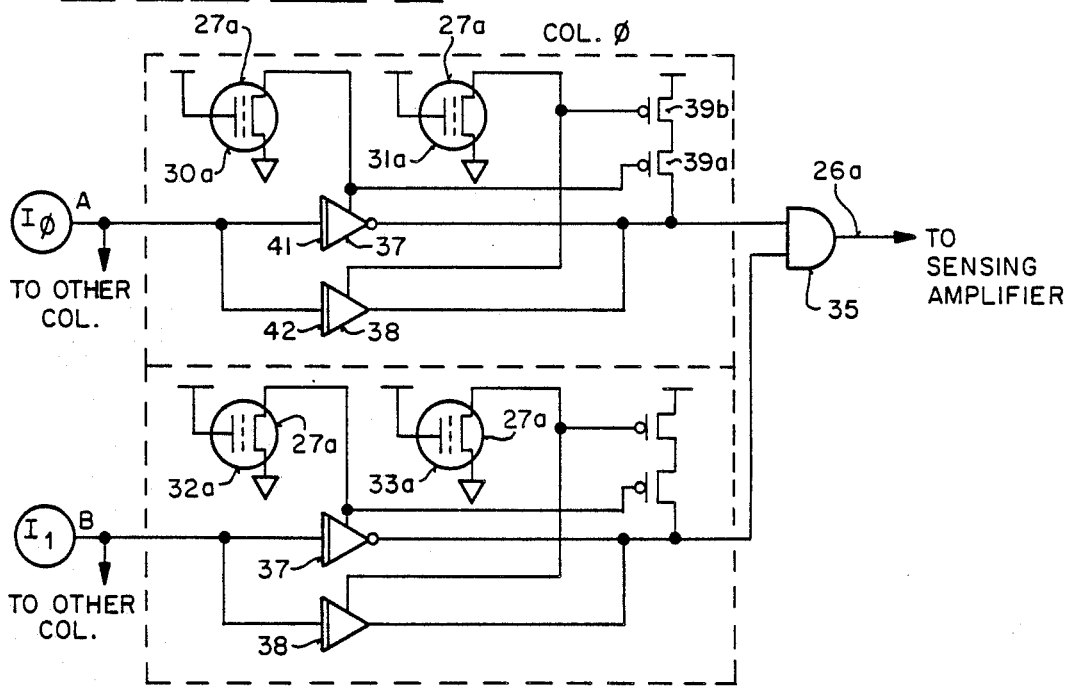
FIG_4
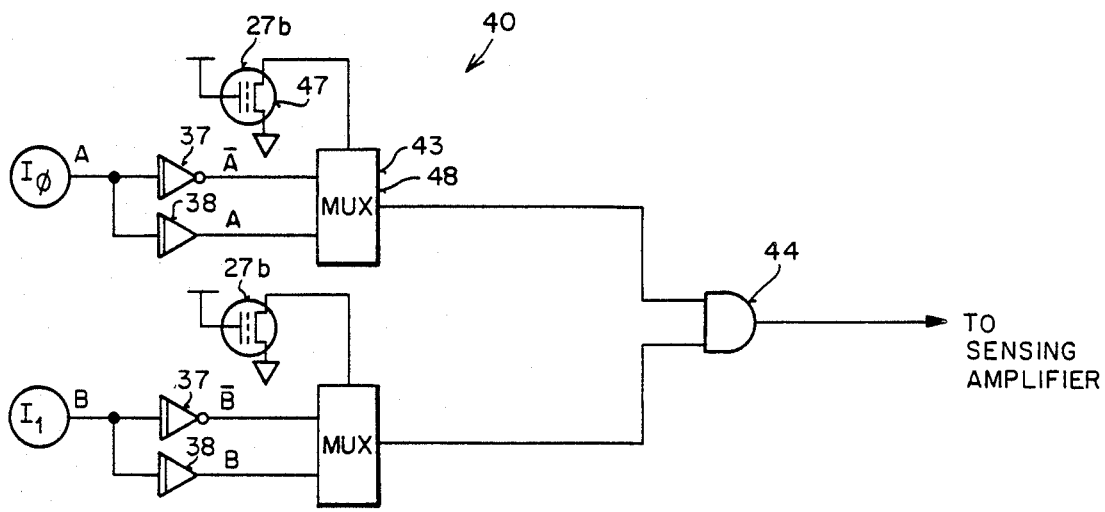
FIG_5

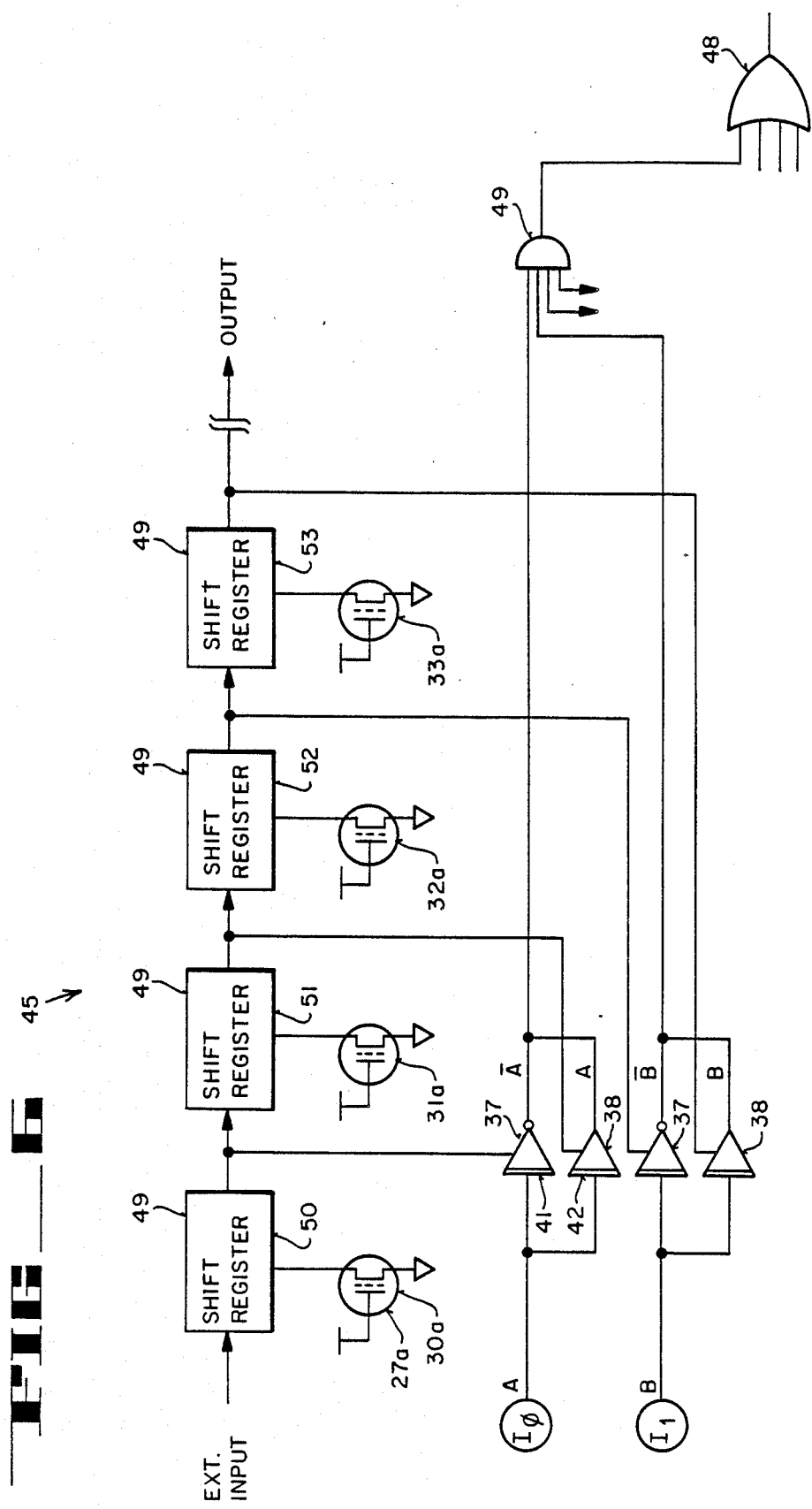
FIG_5

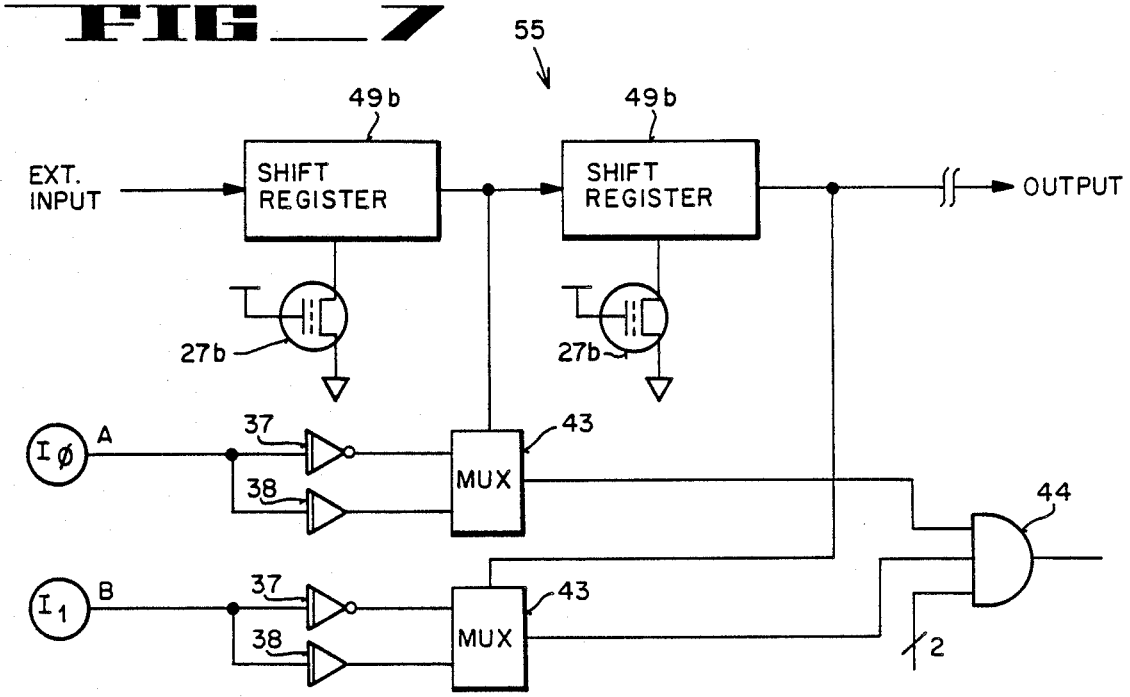
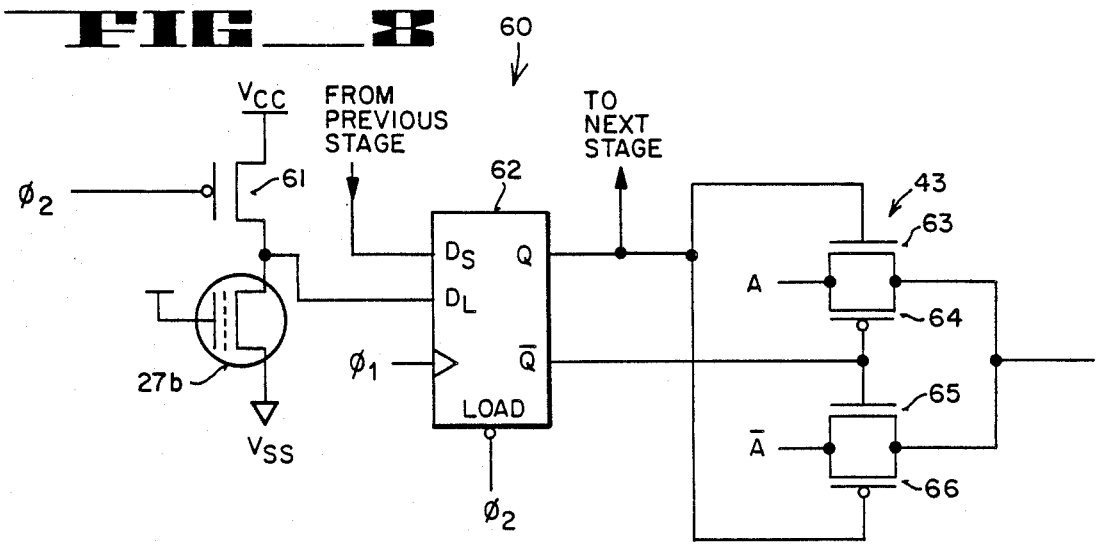

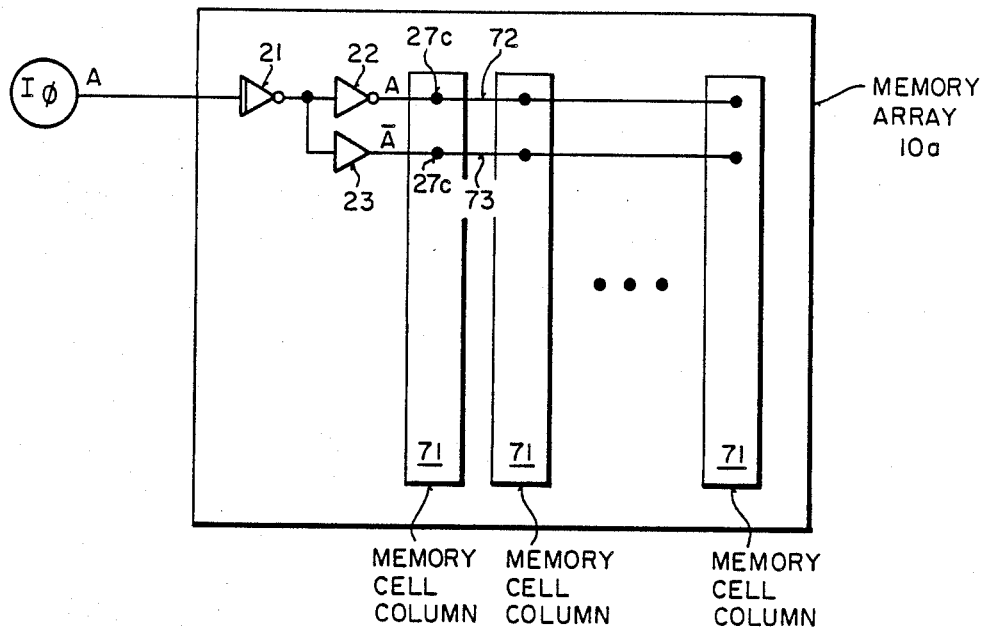
FIG_9
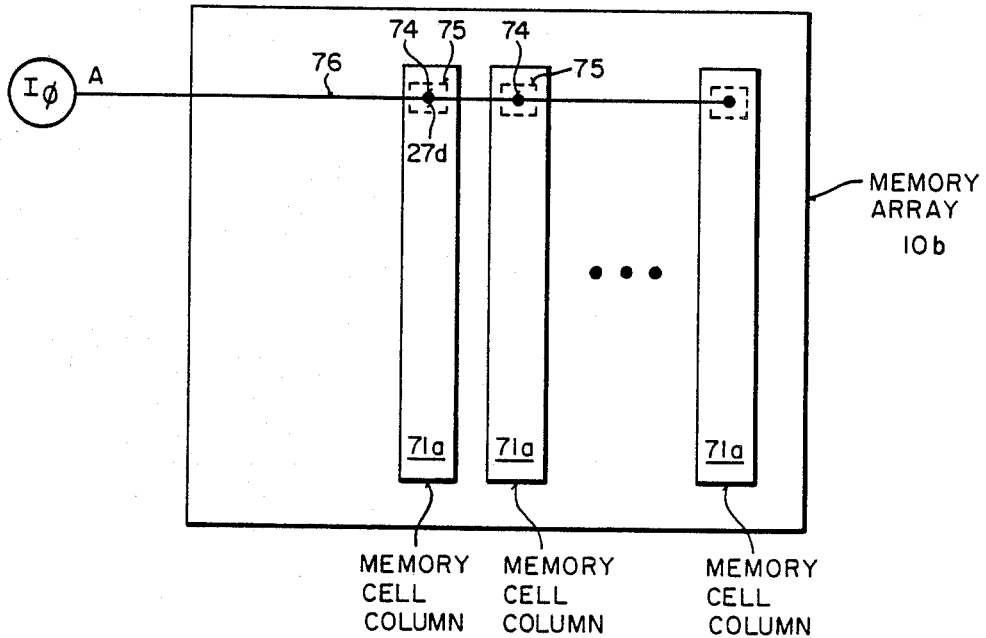
FIG_10

4,930,097

ARCHITECTURE FOR AN IMPROVED PERFORMANCE OF A PROGRAMMABLE LOGIC DEVICE

BACKGROUND OF THE INVENTION

1. Field of the Invention

The present invention relates to the field of programmable logic devices and more specifically to improving the performance of EPROM arrays.

2. Related Application

This application relates to copending U.S. patent application Ser. No. 292,462, filed Dec. 30, 1988, and entitled "Shift Register Programming for a Programmable Logic Device."

3. Prior Art

The manufacture and use of erasable programmable ready-only-memories (EPROMs) are well-known in the prior art. More recently, EPROM devices have been combined with programmable logic arrays to provide devices which are commonly known as programmable logic devices (PLDs). In many instances, PLDs are also erasable and have been referred to as erasable programmable logic devices (EPLDs).

Generally, a memory element for each device is configured into an array, wherein each input to the PLD is divided into an inverting and a non-inverting inputs and in which each input forms a pair of row lines of the memory array matrix. The row lines are typically referred to as word lines. Each column of memory cells are coupled together by column lines which are typically referred to as bit lines. These bit lines of the array are used to provide the output from the memory array. These bit line outputs are thus NOR gates, but are referred to through Boolean transformation as n-term product terms. These product outputs are then logically OR'ed to provide a sum of the products. The technique of using a memory array wherein inputs are provided on the various row lines and the technique of summing the product outputs from the columns of the array are well known in the prior art. Such examples are taught by two U.S. patents to Hartmann et al. (U.S. Pat. Nos. 4,609,986 and 4,617,479) as well as a patent to Birkner et al. (U.S. Pat. No. 4,124,899).

Although a variety of PLD devices are known in the prior art, these devices require the input lines to be coupled to access the EPROM cell. Generally, the input lines are coupled to the control gate of a floating gate EPROM cell, wherein the output of the cell is dependent on the programmed or unprogrammed (erased) state of the EPROM cell of the floating gate, and on the state of the input signal if in the erased state. If a signal path is traced from the input to the output of the memory array, it is noted that the EPROM cell resides within that signal path. That is, the input signal must access the EPROM before an output can be obtained from the PLD. The presence of the EPROM cell in the signal path inhibits the performance, notably speed and power performance, of the PLD. This results from the need to access a given EPROM cell before an output can be obtained and the given EPROM cell can be accessed only after the input signal is present at the control gate.

It is appreciated then that an improvement to the performance of a PLD can be achieved if the memory cell can be removed from the signal path of the device.

SUMMARY OF THE INVENTION

The present invention describes a novel architecture to improve the performance of a programmable logic device by removing the memory cell from the signal path. In one embodiment, input signals are coupled to a combination of level translators and buffers for providing a buffered signal and its complement. Memory cells of the array are coupled to its corresponding buffers such that the state of each memory cell controls the enablement of its appropriate buffer. Because the memory cells can be read prior to the presence of an input signal, less time is required for an output to be generated from the PLD in response to the input signals.

In another embodiment, a multiplexer is coupled to receive the pair of signals from the buffers. The memory cell is again removed from the signal path and the state of a memory cell is used to control its respective multiplexer to select between the input signal and its complement.

In a separate embodiment, the outputs of the memory cells are coupled to a shift register such that the state of the memory cell is latched into the register. Once the information is latched, the memory cells can be turned off to conserve power. The latched information is then used to enable the buffers or to operate the multiplexer of the earlier described embodiment. A plurality of shift registers can be coupled in series wherein external programming signals can be coupled into the shift registers for operating the buffers or the multiplexers. By using external programming through the shift registers, the PLD can be made to emulate the state of programmed cells without actually programming the memory cells.

Finally, a distributed buffer scheme is used so that buffering components are placed directly at the location of the memory cells instead of at the input to the memory array.

BRIEF DESCRIPTION OF THE DRAWINGS

FIG. 1 is a block schematic diagram illustrating basic components of a programmable logic device.

FIG. 2 is a prior art circuit schematic diagram showing elements of a memory array in which memory cells are in the signal path.

FIG. 3 is an equivalent circuit schematic diagram of FIG. 2 for two inputs to the memory array.

FIG. 4 is a circuit schematic diagram showing an architecture or the present invention in which memory cells are removed from the signal path.

FIG. 5 is a circuit schematic diagram of an alternative embodiment of the present invention in which memory cells are removed from the signal path and in which the memory cells are used to control a multiplexer in the signal path.

FIG. 6 is a circuit schematic diagram showing the scheme of FIG. 4 but in which shift registers are used to latch states stored in the memory cells.

FIG. 7 is a circuit schematic diagram showing the scheme of FIG. 5 but in which shift registers are used to latch the states of the memory cells.

FIG. 8 is a circuit schematic diagram illustrating one implementation of using a latch in the architecture of FIG. 7.

FIG. 9 is a schematic diagram showing an implementation of a non-distributed buffer stage at one input to the memory array.

FIG. 10 is a schematic diagram showing a distributed buffer scheme used in the present invention.

DETAILED DESCRIPTION OF THE PRESENT INVENTION

A novel architecture to improve the performance of a programmable logic device (PLD) by removing the memory cell from the signal path is described. In the following description, numerous specific details are set forth, such as specific memory cells and circuit components, etc., in order to provide a thorough understanding of the present invention. It will be obvious, however, to one skilled in the art that the present invention may be practiced without these specific details. In other instances, well-known circuits have not been described in detail in order not to unnecessarily obscure the present invention.

Referring to FIG. 1, a block diagram illustrating the basic components of a PLD is shown. A plurality of input lines, labebled $I_0$–$I_n$, is coupled as an input to a memory array 10. Memory array 10 is comprised of a plurality of memory cells arranged in a matrixed array, such each of the inputs $I_0$–$I_n$ provide signals onto the row lines of the matrix. The outputs of the memory cells are coupled to its appropriate column line and these column lines are coupled to the sensing amplifiers 11. Sensing amplifiers 11 sence the output from the columns and provide an output corresponding to the state of the column lines. The output of the sensing amplifiers 11 is used in a variety of ways. In a typical PLD the outputs from the sencing amplifiers 11 are coupled to macrocells 12. Typically, each macrocell 12 is responsive to a predetermined number of product terms, (p-terms) which are normally ORed together to provide a sum of the product terms. The outputs from the macro cells 12 are then coupled externally to the PLD or is coupled back to the memory array 10 for the purpose of providing feedback inputs to memory array 10. Although only four macrocells 12 are shown in FIG. 1, the actual number is a design choice and will depend on the size of the memory array 10 and the grouping of the p-terms of memory array 10. The operation of sensing amplifiers 11 and macrocells 12 are well known in the prior art.

Referring to FIG. 2, a portion of a prior art circuit 20, which is typically implemented in the memory array 10, comprised of a plurality of memory cells 27 is shown. In the prior art circuit 20, each input $I_0$–$I_n$ is coupled as an input to a level translator 21. The level translator 21 shown in FIG. 2 is also an inverter. The output of the level translator 21 is coupled to an input of an inverted buffer 22 and a non-inverted buffer 23. The output of each buffer 22 or 23 is coupled to its respective row line of the memory array to provide a pair of row lines for each input. For example, for input $I_0$, its corresponding buffer 22 output is provided on row 0 line of the memory array and the output buffer 23 on row 0/ (/ is used here to designate a complement). Normally, the row lines are coupled to the control gate of the EPROM cells of that row. Further, most memory arrays will have a separate row line attributed to the complement of the input signal, which in this case is shown as the row lines coupled to the output of buffer 23.

In FIG. 2, only the first two and the last row stages are shown wherein the first stage is shown having an input A and the second input $I_1$ as having input B. Additionally, the circuit 20 of FIG. 2 shows only those memory cells 24 of column 0. The input of the memory cells 24 of column 0 are all coupled together to line 26, which is generally called a bit line. It is to be noted that the coupling together of all of the memory cells 24 of column 0 provides a Boolean AND function of all of the inputs, as well as complement of the inputs. In the example of FIG. 2, EPROM cell 30 denotes row 0, column 0 position while EPROM cell 31 denotes row 0 complement, column 0 position. Cell 32 denotes row 1, column 0 and cell 32 denotes row 1 complement, column 0 positions. An equivalent CMOS circuit showing the column of memory cells for inputs A and B is showwn in FIG. 3.

In operation, each of the EPROM cells 27 forming the column of cells 24 are either programmed or left erased during the programming phase of the device. If a given cell 27 is in the erased or unprogrammed state, then the conduction or nonconduction of that cell 27 will depend on the state of the input signal applied to its control gate. However, if a given EPROM cell 27 is in a programmed state, then the cell 27 will not conduct. Therefore, only those erased cells will respond to an input signal applied to its control gate. The operation of EPROM cells 27 is well-known in the prior art.

It is to be noted that the prior art circuit 20 provides a certain output on bit line 26 which certain output is dependent on the state of the input signals, as well as the stored state of each of the EPROM cells coupled to that given bit line 26. It is also to be noted that a given EPROM cell 27 resides in the actual signal path of the memory array. For example, looking at the portion of circuit 20 corresponding to input $I_0$, EPROM cells 30 and 31 reside in the actual signal path. That is, once signal A is present on input line $I_0$, signal A is impressed on the control gate of cell 30 and 31, before an output from cell 30 and/or 31 can be provided onto bit line 26. If cell 30 and/or 31 must change conductive states due to the input signal, the cell transistor must change its state, such as from nonconduction to conduction, before a proper output can be provided from that memory cell. An appreciable amount of time is required for a transistor to change between conducting and nonconducting states, or vice versa. The transitioning period can increase significantly, if the voltage swing of the bit line 26 is caused to transition between a higher voltage and ground. That is, a transition period between 5 volts and ground takes less time than a transitioning period between 15 volts and ground. Further, if a number of cells of a given column conduct simultaneously, then considerable current drain can be experienced on bit line 26, resulting in a longer period of time before the sensing amplifier can recover to its steady state.

In order to reduce the response time of a memory cell 27 and therefore to improve the overall speed of the PLD, prior art circuits, such as circuit 20, have implemented the use of a current driver to drive bit line 26. In FIG. 2, a current driver 29 is shown coupled between the supply, VCC, and a bit line 26. Current source 29, which is typically a transistor device, remains on to provide a steady state current during high speed operation mode of the device. Under steady state conditions, bit line 26 is biased to a predetermined bias point. When memory cell conduction occurs, the sensing amplifier coupled to bit line 26 senses a change from this biasing point as a state change on bit line 26. However, this technique results in a significant disadvantage. Although higher speed operation can be achieved, significantly higher current is required for the PLD, because of the continued operation of current source 29. This increase in current generally implies a requirement for consuming more power, as well as dissipating additional power.

Referring to FIG. 4, an architecture of the present invention, in which the EPROM cells 27a are removed from the signal path, is shown. EPROM cells 30a, 31a, 32a and 33a are equivalent to those EPROM cells 30-33 of FIGS. 2 and 3, but with a suffix added. However, in the circuit of FIG. 4, the control gate of each of the EPROM cells is coupled to a voltage, such as 5 volts, which causes conduction of the cell if that cell is erased. The output of the various cells 27a are coupled, not to the bit line, but rather to a respective level translator/-buffer 37 or 38 (hereinafter buffer) for enabling its respective buffer 37 or 38. Each of the inputs $I_0-I_n$ (only $I_0$ and $I_1$ are shown in FIG. 4) is coupled to an inverting level translator/buffer 37 and each input is also coupled to a noninverting level translator/buffer 38. It is to be appreciated that buffers 37 and 38 can be comprised of separate level translator devices and separate buffers. The outputs of the buffers 37 and 38 are coupled to bit line 26a, along with the outputs from the other buffers 37 and 38 of the same column. In the circuit of FIG. 4, each pair of outputs is coupled together and then coupled as an input to an AND gate, which provides the AND function for all terms coupled to its input. In FIG. 4 the two inputs $I_0$ and $I_1$ are combined at the output by AND gate 35 to provide a product term for determining the operator logic for A and B.

Each of the EPROM cells 27a is coupled to its respective buffer 37 and 38 to enable it, only if that cell is erased. For example, in FIG. 4, buffer 41 is enabled by the state of the cell 30a and buffer 42 is enabled by state of cell 31a. A is designated as an input $I_0$. A/ will appear at the output if buffer 41 is enabled due to the erased state of cell 30a and A will be at the output if buffer 42 is enabled due to the erased state cell 31a. If both memory cells 30a and 31a are programmed then the input signal will have no effect on the output. If for some reason both cells 30a and 31a are in the erased state, the output line of buffers 41 and 42 are pulled high due to the conduction of two series p-type transistors 39a and 39b, which gates are coupled to the cells 30a and 31a, respectively. Each pair of memory cells for each input operate equivalently. The use of AND gate 35 provides the selection of a predetermined number of inputs which are to be ANDed.

It is to be noted that in FIG. 4 only the EPROM cell 27a is shown and its load transistor is not shown for simplicity. However, it is understood that the EPROM cell of FIG. 4, as well as in subsequent Figures, requires a load transistor for proper operation. Such loads are exemplified as device 29 in FIG. 3, or device 61 in FIG. 8.

It is to be appricated that the architecture of the present invention removes the EPROM memory cells 27a from the signal path of the device. That is, each of the EPROM cells 27a control the enablement of its respective buffer 37 or 38. Because the EPROM cells 27a are removed from the signal path, each of the EPROMs can provide the enabling or disabling of its respective buffer 37 or 28 before an input signal is provided at the input terminal of the memory array. Then, once an input is provided on a given input line $I_0-I_n$ it need only be coupled through the respective buffer to provide the proper output onto bit line 26a. The speed performance increases because the EPROM cells 27a can be accessed prior to the presence of the input signal.

Referring to FIG. 5, an alternative circuit 40 practicing the present invention is shown. Each input is coupled to buffers 37 and 38, as was the case with the circuit of FIG. 4. Although only two inputs $I_0$ and $I_1$ are shown in FIG. 5, the actual number of inputs is purely a design choice. Each buffer combination 37 and 38 provides an inverted and a non-inverted output of the input signal. The outputs of the buffers 37 and 38 are not coupled together as it was done in the circuit of FIG. 4. Instead, each output combination from each set of buffers 37 and 38 are coupled as an input to a multiplexer (MUX) 43. The section of which input of the multiplexer 43 is coupled to its output is determined by the stored state of an EPROM cell 27b that is coupled to its MUX 43. For example, for input $I_0$, if cell 47 is in a programmed state, then it will cause its MUX 48 to select one of the inputs, A or A/, and if the cell 47 is in an erased condition then it will select the other input A/ or A, respectively.

It is to be noted that in circuit 40, one EPROM cell 27b is utilized to control the operation of MUX 43 for a given column-row position. The output of MUX 43 is coupled as an input to its respective AND gate 44 which output provides the product term to a sensing amplifier. It is to be appreciated that the number of inputs coupled to a given AND gate 44 determines the number of product terms and this is merely a design choice. It is to be noted that circuit 40 includes an additional device in the way of multiplexer 43 in the signal path, however, the actual number of EPROM cells has been reduced by one half since one EPROM cell is needed to control each MUX 43 for selection between an input and its complement. It is also to be noted that the EPROM cell 27b is still removed from the signal path to improve the speed performance of the PLD.

Referring to FIG. 6, an alternative embodiment to the circuit of FIG. 4 is shown. Again, only two inputs are shown as A and B, however the actual number is a design choice. Circuit 45 of FIG. 6 has each input coupled to buffers 37 and 38, and which outputs provide an inverting and non-inverting output of the signal, respectively. These outputs are coupled together to provide an input to AND gate 49. The output of the AND gates 49 is coupled as an input to an OR gate 48, which output provides the sum of the product terms. A number of equivalent AND gate outputs are coupled as inputs to OR gate 48. The actual arrangement of the product terms is again arbitrary and the arrangement of the AND gate shown in FIG. 6 is for illustrative purpose only. It is to be noted that other logic gates can provide the equivalent logic fuctions through Boolean transformation.

The alternative scheme of circuit 45 uses a shift register in combination with the EPROM cell 27a to enable each of the buffers 37 or 38. Instead of coupling each EPROM cell 27a directly to the buffers 37 or 38, as was the case in the circuit of FIG. 4, the output of each EPROM cell 27a is coupled to a shift register 49. That is, cell 30a is coupled to provide an output to shift register 50, cell 31a to shift register 51, cell 32a to shift register 52 and cell 33a to shift register 53. The output of each shift register 49 is coupled to its corresponding buffer 37 or 38. For example, shift register 50 is coupled to buffer 41 and register 51 to buffer 42. Further, the shift registers corresponding to a given column of EPROM cells are all coupled together in series so that output of shift register 50 is not only coupled to buffer 41 but also an input to shift register 51. The output of shift register 51 is coupled to buffer 42, as well as to the corresponding shift register 52 for the next buffer of the column and etc. The very first register 50 corresponding to the first memory cell 30a of the column receives an external input and the very last shift register in the sequence corresponding to the last memory cell of the column provides an output for external use. A sequence of shift registers 49 are provided for each column of memory cells.

In operation, the shift registers 49 are utilized to latch the output of the EPROM cells 27a to its respective buffer 37 or 38, prior to the presentation of the input signal. The stored state of each EPROM cell 27a is determined by causing the output of each memory cell 27a to be latched into its corresponding shift register 49. When shift register 49 has latched the output from its corresponding memory cell 27a, then the reading of each memory cell is completed and the reading operation can cease. That is, once the information is latched into shift registers 49, memory cells 27a no longer need to conduct and all of the cells can be turned off. This turning off of the memory cells 27a conserves power, because none of the EPROM cells 27a need to conduct once the information is latched. The latched information is provided as an output from each of these shift registers 49 to its corresponding buffers 37 or 38. At this point, input signals can be provided at the input. It is to be noted that the memory cells 27a are again not in the signal path.

If latching is all that is needed from shift registers 49, then shift register 49 can be replaced by latches. However, in this alternative embodiment shift registers 49 are used for an added purpose. It is to be appreciated that for certain purposes, such as for testing, evaluating and debugging, it would be advantageous to quickly alter the programming sequence of the PLD. For example, in a prior art PLD device using EPROM cells, a given programming pattern would need to be programmed to the various EPROM cells to conduct a performance evaluation of the device. If this programming pattern is changed, then the cells must be erased and then reprogrammed. In a typical ultraviolet (UV)EPROM, a time lapse of one hour may be needed to erase and reprogram a new pattern. Even with the use of the more recent flash EPROM devices, it may still take a full second to erase and reprogram a pattern. With circuit 45 of the present invention, the reprogramming sequence can be reduced, even to the order of $10^{-5}$ seconds per pattern.

In order to achieve such a short time period between patterns, shift registers 49 are used. Instead of reprogramming the cells 27a, desired programming patterns are inputted externally. The information is shifted serially into the sequence of registers 49 to emulate the output from the memory cells. Instead of reprogramming the memory cells 27a, the information is latched into each shift register. When this latching in completed, circuit 45 will respond to an input signal as though memory cells 27a are programmed. The speed performance is obtained because the shift registers operate at a much faster rate than the erasing and programming of the EPROM cells.

Further, the arrangement of the EPROM cells 27a and shift registers 49 of circuit 45 are also capable of shifting information latched in from a given memory cell and later applied to buffer corresponding to column elements of a different row. It is to be appreciated also that the sequence of shift registers 49 coupled in series is provided for each column of memory cells. Further, the output of the very last shift register in the sequence can provide an output external to the device, which output provides a sequence of data corresponding to information which is stored in the EPROM cells 27a.

Referring to FIG. 7, a shift register implementation of the circuit 40 of FIG. 5 is shown. Lever translator/buffers 37 and 38, MUXs 43 and AND gate 44 function equivalently to those of circuit 40 shown in FIG. 5. However in circuit 55, instead of the MUXs 43 being coupled directly to the EPROM cells 27b, the output of the EPROM cells 27b are latched through shift register 49b. The EPROM cells 27b and the shift registers 49b function equivalently to those same components shown in FIG. 6. However, in FIG. 7, only a single EPROM cell is used to control MUX 43, as was the case in circuit 40. The output of the EPROM cell 27b is latched into its corresponding shift register 49b, which selects one of two inputs of each MUX 43 to be coupled to its output. External inputs can be provided to the shift registers equivalently to that of circuit 45 of FIG. 6. The external inputs to shift registers 49a allow for a faster programming sequence without the requirement of storing programming information in individual EPROM cells 27b. Also, AND gate 44 is shown as having four inputs, however, the actual number of inputs forming a product term is a design choice.

Referring to FIG. 8, a complementary metal oxide semiconductor (CMOS) circuit implementation of the circuit 55 of FIG. 7 is shown. Circuit 60 only shows those components corresponding to a single signal path, namely A in the example. A p-type transistor 61 is coupled in series with an EPROM memory cell 27b between Vcc and Vss, which in this case is ground. Transistor 61 and cell 27b operate as a clocked CMOS transistor pair. A clocking signal, $\phi_2$, is coupled to the gate of transistor 61 and the load input of flip-flop 62. The output of the memory cell 27b, which is at the drain of memory cell 27b, is coupled as the $D_L$ input to a loadable D type flip-flop 62. Flip-flop 62 operates as a latch loaded by $\phi_2$, but having its $D_S$ input coupled to the output of the previous stage and its output coupled to the $D_S$ input of the subsequent stage allows the D-latch 62 to operate as a shift register. A second clocking signal, $\phi_1$, is coupled to clock the D type flip-flop 62.

Transistor 63–66 operate as MUX 43, wherein transistor 63 and 65 are n-type devices and transistor 64 and 66 are p-type devices. Transistor 63 and 64 conduct together to permit the feed through of signal A, whereas transistors 65 and 66 alternatively conduct together to permit the feed through of A/ to be coupled to the output. The non-inverting output of register 62 is coupled to the gates of transistor 63 and 66. The inverted output of register 62 is coupled to the gates of transistor 64 and 65. Therefore, in operation, if the non-inverting output Q is high, then transistor 63 and 64 conduct while in the other state transistor 65 and 66 conduct.

In operation, when $\phi_2$ clocking signal goes low, the information stored in memory cell 27b is used. Cell 27b will conduct if it is in a erased state and it will not conduct if it is programmed. Once the output of memory cell 27b is stabilized, clocking signal $\phi_2$ causes this information to be latched into register 62. Once the information has been latched to register 62, clocking signal $\phi_2$ need not remain high to continue to read the information stored in memory cell 27b. The information latched into register 62 causes a conduction of one pair of CMOS transistor 63–64 or 65–66 to cause the feedthrough of either signal A or A/.

Referring to FIG. 9, a memory array 10a which is equivalent to memory array 10 of FIG. 1 is shown, having a plurality of memory cells 27c arranged in columns 71. In a prior art architectural scheme, such as circuit 20 of FIG. 2, only one set of level translator 21 and buffers 22 and 23 are used for each input line, such as $I_0$. The outputs of buffers 22 and 23 are then coupled to its respective row line 72 and 73, respectively, and these row lines are coupled to the corresponding row of cells. Although this prior art scheme can be readily implemented with the circuits of the present invention, an alternative architectural scheme shown in FIG. 10 is used.

Referring to FIG. 10, a memory array 10b having a plurality of memory cells 27d arranged in columns 71a is shown. An input line $I_0$ is shown wherein the input is coupled to its corresponding row of memory cells 27d within each column 71a. However, with this alternative scheme the buffers 37 and 38 distributed to each memory cell area 74, such that instead of having a pair of buffers for a complete row line as shown in FIG. 9, the architecture in FIG. 10 includes buffers 37 and 38 at each memory location 74 as shown by dotted line 75. The distribution scheme of FIG. 10 requires a single row line 76 instead of the dual line 72 and 73 scheme of FIG. 9. This distribution has the added advantage of reducing the number of row lines and providing different buffer schemes at each memory location 74. It is to be appreciated that although the preferred embodiment distributes the buffers 37 and 38, as well as MUXs 43 and shift registers 49 if these devices are used, the prior art dual line 72 and 73 scheme can be readily implemented to practice the present invention.

It is to be appreciated that although a particularly PLD is described utilizing the architecture of the present invention, wherein the EPROM cell is removed from its signal path, this scheme can be readily implemented in other devices and is not limited to a PLD. Further, other memory devices other than EPROMs can be readily used for the described memory cells. Additionally, the EPROM cells shown in FIGS. 4-7 require a load transistor for proper operation, but such has not been included in order not to clutter the drawing. Such load devices for EPROM cells are well-known. A CMOS implementation is shown as transistor 61 in FIG. 8. Therefore, for a CMOS implementation in FIGS. 4-7, a p-type transistor is coupled between Vcc and the output of each memory cell to perform as a load device. Further, the scheme shown by transistor 39a and 39b in FIG. 4 can be readily adapted in the circuits of the other Figures.

We claim:

1. In a programmable logic device (PLD) having a plurality of inputs and a plurality of outputs, an apparatus for operating on said inputs according to a stored program, comprising:
   a plurality of memory cells for storing said program;
   a plurality of buffers, wherein each of said buffers is coupled to receive a selective one of said inputs and, if enabled, provides a corresponding output;
   for each said buffer, a corresponding one of said memory cells is coupled to enable said buffer for passing said input signal as said corresponding output, wherein enablement of each said buffer is determined by a stored state of its corresponding memory cell and wherein said corresponding output from each said buffer provides for said plurality of outputs from said PLD.

2. The apparatus of claim 1 wherein each said buffer is comprised of an inverter and a non-inverter such that one of said inverter and non-inverter is enabled by its buffer's corresponding memory cell.

3. The apparatus of claim 2 wherein outputs from each pair of said inverter and non-inverter are coupled together as inputs to an AND gate.

4. The apparatus of claim 3 wherein said memory cells are comprised of an erasable programmable read-only-memory (EPROM).

5. The apparatus of claim 4 wherein said memory cells are arranged in an array and selective pairs of inverter and non-inverter outputs are coupled to one of a plurality of AND gates and an output from each AND gate provides for a product term for said PLD.

6. A programmable logic device (PLD) having a plurality of inputs and a plurality of outputs, wherein said outputs are determined by a stored program operating on said inputs, comprising:
   a plurality of memory cells arranged in an array for storing said program;
   a plurality of buffers for buffering said inputs if enabled, wherein each of said inputs is coupled to a pair of said buffers, said pair being an inverter and a non-inverter;
   for each said buffer, a corresponding one of said memory cells is coupled to enable its buffer for passing said input signal or its complement, wherein enablement of each said buffer is determined by a stored state of said corresponding memory cell.

7. The PLD of claim 6 wherein each said buffer also provides level translation of said input.

8. The PLD of claim 7 wherein outputs from each pair of said inverter and non-inverter are coupled together to provide an input to an AND logic means to determine a product term from said array.

9. The PLD of claim 8 wherein said memory cells are comprised of an erasable programmable read-only-memory (EPROM).

10. The PLD of claim 9 wherein said buffers are distributed within said array and disposed proximate to said corresponding memory cell.

11. A programmable logic device (PLD) having a plurality of inputs and a plurality of outputs wherein said outputs are determined by a stored program operating on said inputs, comprising:
   a plurality of memory cells for storing said program;
   a plurality of buffers wherein each of said inputs is coupled to at least one of said buffers;
   a plurality of multiplexers (MUXs) each coupled to a corresponding buffer for receiving an output from its corresponding buffer as its input;
   for each said MUX, a corresponding one of said memory cells is coupled to enable said MUX for passing its input signal as an output from said MUX, wherein enablement of said MUX is determined by a stored state of said corresponding memory cell.

12. The PLD of claim 11 wherein said buffer for each said input is comprised of an inverter and a non-inverter and outputs of said inverter and non-inverter are coupled as a complement pair of inputs to its MUX and said corresponding memory cell for its MUX selects between said complement pair of inputs.

13. The PLD of claim 12 wherein outputs from said MUXs are coupled together to provide an input to an AND logic means to determine a product term from said PLD.

14. The PLD of claim 13 wherein said memory cells are comprised of an erasable programmable read-only-memory (EPROM).

15. A programmable logic device (PLD) having a plurality of inputs and a plurality of outputs wherein said outputs are determined by a stored program operating on said inputs, comprising:

a plurality of memory cells arranged in an array for storing said program;

a plurality of buffers for buffering said inputs, wherein each of said inputs is coupled to a pair of said buffers, said pair being an inverter and a non-inverter;

a plurality of multiplexers (MUXs) each coupled to a corresponding pair of buffers to receive its input and its complement;

for each said MUX, a corresponding one of said memory cells is coupled to select between its corresponding input or its complement, wherein selection of said MUX is determined by a stored state of said corresponding memory cell.

16. The PLD of claim 15 wherein each said buffer also provides level translation of said input.

17. The PLD of claim 16 wherein outputs from said MUS are coupled together to provide an input to an AND logic means to determine a product term from said PLD.

18. The PLD of claim 16 wherein said memory cells are comprised of an erasable programmable read-only-memory (EPROM).

* * * * *

UNITED STATES PATENT AND TRADEMARK OFFICE
CERTIFICATE OF CORRECTION

PATENT NO. : 4,930,097

DATED : May 29, 1990

INVENTOR(S) : Ledenbach et al.

It is certified that error appears in the above-identified patent and that said Letters Patent is hereby corrected as shown below:

| | | |
|---|---|---|
| col. 02, line 48 | delete "or" | insert --of-- |
| col. 03, line 19 | delete "compised" | insert --comprised-- |
| col. 03, line 21 | after "such" | insert --that-- |
| col. 03, line 25 | delete "sence" | insert --sense-- |
| col. 03, line 29 | delete "sencing" | insert --sensing-- |
| col. 03, line 54 | after "output" | insert --of-- |
| col. 03, line 65 | delete "input" | insert --output-- |
| col. 04, line 02 | after "as" (2nd occurrence) | insert --the-- |
| col. 04, line 08 | delete "showwn" | insert --shown-- |
| col. 04, line 54 | delete "a" | |
| col. 05, line 28 | delete "and" | insert --or-- |
| col. 05, line 34 | after "state" | insert --of-- |
| col. 05, line 52 | delete "appricated" | insert --appreciated-- |
| col. 05, line 66 | after "40" | insert --for-- |
| col. 06, line 09 | delete "section" | insert --selection-- |
| col. 06, line 38 | after "the" | insert --input-- |
| col. 06, line 65 | after "also" | insert --as-- |
| col. 07, line 20 | delete "27aneed" | insert --27a need-- |
| col. 07, line 54 | delete "in" | insert --is-- |
| col. 07, line 63 | delete "buffer" | insert --buffers-- |

UNITED STATES PATENT AND TRADEMARK OFFICE
CERTIFICATE OF CORRECTION

PATENT NO. : 4,930,097

DATED : May 29, 1990

INVENTOR(S) : Ledenbach et al.

It is certified that error appears in the above-identified patent and that said Letters Patent is hereby corrected as shown below:

| | | |
|---|---|---|
| col. 08, line 04 | delete "lever" | insert --level-- |
| col. 08, line 10 | delete "the" (2nd occurrence) | |
| col. 08, line 19 | delete "49a" | insert --49b-- |
| col. 08, line 57 | delete "aherased" | insert --an erased-- |
| col. 09, line 17 | after "38" | insert --are-- |
| Title page, item [57] Abstract, line 03 | after "and" | insert --a-- |

Signed and Sealed this

First Day of February, 1994

*Attest:*

*Attesting Officer*

BRUCE LEHMAN

*Commissioner of Patents and Trademarks*